United States Patent
Cho et al.

(10) Patent No.: US 8,680,497 B2
(45) Date of Patent: Mar. 25, 2014

(54) SUPERHYDROPHOBIC ELECTROMAGNETIC FIELD SHIELDING MATERIAL AND METHOD OF PREPARING THE SAME

(75) Inventors: Eun-Hyoung Cho, Hwaseong-si (KR); Jin Seung Sohn, Seoul (KR); Sung Hoon Park, Seoul (KR); Chang Youl Moon, Suwon-si (KR); Ha Jin Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/536,678

(22) Filed: Jun. 28, 2012

(65) Prior Publication Data

US 2013/0075632 A1 Mar. 28, 2013

(30) Foreign Application Priority Data

Sep. 28, 2011 (KR) .................. 10-2011-0098359

(51) Int. Cl.
*H01J 1/52* (2006.01)
(52) U.S. Cl.
CPC ........................................ *H01J 1/52* (2013.01)
USPC .................................... 250/505.1; 250/515.1
(58) Field of Classification Search
USPC ........................................... 250/505.1, 515.1
See application file for complete search history.

(56) References Cited

U.S. PATENT DOCUMENTS

| | | | |
|---|---|---|---|
| 2009/0018249 A1* | 1/2009 | Kanagasabapathy et al. | 524/434 |
| 2010/0021692 A1 | 1/2010 | Bormashenko et al. | |
| 2010/0129608 A1 | 5/2010 | Low et al. | |
| 2010/0183864 A1* | 7/2010 | Qi et al. | 428/319.1 |
| 2010/0184346 A1* | 7/2010 | Qi et al. | 442/76 |
| 2011/0195181 A1 | 8/2011 | Jin et al. | |
| 2011/0300345 A1 | 12/2011 | Bessonov et al. | |
| 2012/0107556 A1 | 5/2012 | Zhang et al. | |
| 2012/0177881 A1 | 7/2012 | Lee et al. | |
| 2012/0258283 A1 | 10/2012 | Sohn et al. | |
| 2013/0075632 A1 | 3/2013 | Cho et al. | |
| 2013/0122195 A1 | 5/2013 | Kim et al. | |

FOREIGN PATENT DOCUMENTS

| JP | 2008-231344 A | 10/2008 |
|---|---|---|
| KR | 20070044437 A | 4/2007 |
| KR | 2009-0020008 A | 2/2009 |
| KR | 20090098566 A | 9/2009 |

(Continued)

OTHER PUBLICATIONS

Ha, S. et al., "Surface Wettability in Terms of Prominence and Depression of Diverse Microstructures and Their Sizes", Feb. 20, 2007, pp. 679-685.

(Continued)

*Primary Examiner* — Kiet T Nguyen
(74) *Attorney, Agent, or Firm* — Harness, Dickey & Pierce, P.L.C.

(57) ABSTRACT

A superhydrophobic electromagnetic field shielding material includes a curable resin and a carbon material, the superhydrophobic electromagnetic field shielding material including at least two depression patterns on an exposed surface. The at least two depression patterns may include a first depression pattern including a plurality of grooves having a same shape and a second depression pattern including a plurality of grooves having a same shape. The carbon material may be about 3 wt % to about 20 wt % based on the total weight of the superhydrophobic electromagnetic field shielding material.

20 Claims, 14 Drawing Sheets

(56) References Cited

FOREIGN PATENT DOCUMENTS

| KR | 20090102922 A | 10/2009 |
|---|---|---|
| KR | 2010-0003419 A | 1/2010 |
| KR | 2010-0008579 A | 1/2010 |
| KR | 2010-0084971 A | 7/2010 |
| KR | 20100076439 A | 7/2010 |
| KR | 2011-0003535 A | 1/2011 |
| KR | 10-2012-0113532 A | 10/2012 |

OTHER PUBLICATIONS

Lee, S. et al., "The Effect of Micro Nano Multi-Scale Structures on the Surface Wettability", Jan. 10, 2008, pp. 424-429.

Zou, J. et al., "Preparation of a Superhydrophobic and Conductive Nanocomposite Coating from a Carbon-Nanotube-Conjugated Block Copolymer Dispersion", Adv. Mater., 20, 2008, pp. 3337-3341.

Park, S. H. et al., "Enhanced dielectric constants and shielding effectiveness of, uniformly dispersed, functionalized carbon nanotube composites", Appl. Phys. Lett., 94, 243111 (2009).

Park, S.H. and Bandaru, P.R., "Improved mechanical properties of carbon nanotube/polymer composites through the use of carboxyl-epoxide functional group linkages", Polymer 51, 2010, pp. 5071-5077.

Peng, M. et al., "Nonaligned Carbon Nanotubes Partially Embedded in Polymer Matrixes: A Novel Route to Superhydrophobic Conductive Surfaces", Langmuir, 26(16), 2010, pp. 13572-13578.

S. Herminghaus, "Roughness-induced non-wetting," *Europhys. Lett.,* vol. 52, No. 2, pp. 165-170 (2000).

E. Bormashenko, et al., "Wetting Properties of the Multiscaled Nanostructured Polymer and Metallic Superhydrophobic Surfaces," *Langmuir,* vol. 22, pp. 9982-9985 (Oct. 24, 2006).

J. Bico, et al., "Wetting of textured surfaces," *Physicochem. Eng. Aspects,* vol. 206, p. 41-46 (2002).

\* cited by examiner

SUPERHYDROPHOBIC
ELECTROMAGNETIC FIELD SHIELDING
MATERIAL AND METHOD OF PREPARING
THE SAME

CROSS-REFERENCE TO RELATED APPLICATION

This application claims priority to and the benefit of Korean Patent Application No. 10-2011-0098359 filed in the Korean Intellectual Property Office on Sep. 28, 2011, the entire contents of which are incorporated herein by reference.

BACKGROUND

1. Field

Example embodiments provide a superhydrophobic electromagnetic field shielding material and a method of preparing the same.

2. Description of the Related Art

A thermoplastic resin and a carbon nanotube composite material have been developed for use in an electromagnetic field shield. However, when the electromagnetic field shield is applied in the field where the carbon nanotubes of the composite material are exposed to the external environment, the characteristics of the composite material may be deteriorated by pollution. To overcome this problem, a material having a superhydrophobic characteristic with a self-cleaning property may be applied to the surface of the composite material. Superhydrophobicity refers to a physical characteristic of a material where the surface of an object is difficult to wet.

Thus far, studies have actively progressed for embodying superhydrophobicity by coating a superhydrophobic material on a glass substrate or a heterogeneous substrate, e.g., a polymer.

SUMMARY

Example embodiments provide superhydrophobic electromagnetic field shielding material with improved electromagnetic field shield performance and durability, while having superhydrophobicity.

Example embodiments also provide a preparation method of the superhydrophobic electromagnetic field shielding material.

According to example embodiments, a superhydrophobic electromagnetic field shielding material may include a curable resin and a carbon material, the superhydrophobic electromagnetic field shielding material including at least two depression patterns on an exposed surface. The at least two depression patterns may include a first depression pattern including a plurality of grooves having a same shape and a second depression pattern including a plurality of grooves having a same shape. The carbon material may be about 3 wt % to about 20 wt % based on the total weight of the superhydrophobic electromagnetic field shielding material.

The curable resin may be one of a thermosetting resin, a photocurable resin, and a combination thereof. The curable resin may be a thermosetting resin selected from a group including one of an epoxy resin, a polyester resin, and a combination thereof, or a UV curable resin selected from a group including one of urethane acrylate, perfluoropolyether (PFPE), a silicon-based UV curable resin, a polydimethylsiloxane-based UV curable resin, an epoxy-based UV curable resin, a urethane-based UV curable resin, and a combination thereof.

The carbon material may be one of single-walled carbon nanotubes, double-walled carbon nanotubes, multi-walled carbon nanotubes, and a combination thereof. The carbon material may have a functional group of COOH.

At least one of the first depression pattern and the second depression pattern may be respectively formed such that the plurality of grooves of the same shape of each of the first depression pattern and the second depression pattern are disposed in a triangle array.

The triangle array may be an equilateral triangle array, and the plurality of grooves of each of the first depression pattern and the second depression pattern may be arranged in the shape of a hexagon such that the plurality of grooves are located in at least one of a center and vertexes of the hexagon.

A protruding portion may be on the exposed surface of the superhydrophobic electromagnetic field shielding material.

A size of one groove of the plurality of grooves of at least one of the first depression pattern and the second depression pattern is d, a distance between the plurality of grooves at least one of the first depression pattern and the second depression pattern is p, and a pattern radius satisfies an equation $\lambda=d/p$, and the first depression pattern and the second depression pattern are formed so as to satisfy the following Equation 4:

$$\cos \theta^* = \phi_L(\phi_S \cos \theta_E + (\phi_S - 1)) + (\phi_L - 1) \qquad <\text{Equation 4}>$$

wherein $\theta^*$ is a contact angle at the exposed surface where the first depression pattern and the second depression pattern are formed, $\theta_E$ is a contact angle at a solid surface before the first depression pattern and the second depression pattern are formed, and $\phi_L$ is calculated from $\phi = 1 - (\pi/2\sqrt{3})\lambda^2$ using $\lambda$ for the first depression pattern and $\phi_S$ is calculated from $\phi = 1 - (\pi/2\sqrt{3})\lambda^2$ using $\lambda$ for the second depression pattern.

According to example embodiments, a method of manufacturing superhydrophobic electromagnetic field shielding material may include coating an electromagnetic field shielding material composition on a substrate to form an electromagnetic field shielding material composition layer, the electromagnetic field shielding material composition including a curable resin and about 3 wt % to about 20 wt % of a carbon material based on the total weight of the superhydrophobic electromagnetic field shielding material, imprinting the electromagnetic field shielding material composition layer using a pattern shaping mold, the pattern shaping mold including a surface configured to form at least two depression patterns on an exposed surface of the electromagnetic field shielding material composition layer, and curing a region of the electromagnetic field shielding material composition layer where the at least two depression patterns are formed.

The carbon material in the electromagnetic field shielding material composition may be carbon nanotubes that are chemically pretreated with an acid solution. The pattern shaping mold may be made of one of metal, quartz, and a polymer material. The pattern shaping mold may be made of the polymer material, and the polymer material may be transparent so as to transmit light.

The curing process may be a photocuring process that includes irradiating the region of the electromagnetic field shielding material composition layer where the at least two depression patterns are formed with UV light through the pattern shaping mold made of the transparent polymer material. The polymer material may be one of polyurethane, polydimethylsiloxane (PDMS), silicon oxide ($SiO_2$), and a combination thereof. The curing process may be a heat curing process. The imprinting may be performed at room temperature.

According to example embodiments, a superhydrophobic electromagnetic field shielding material may include a curable resin including one of a thermosetting resin, a photocurable resin, and a combination thereof, and a carbon material including one of single-walled carbon nanotubes, double-walled carbon nanotubes, multi-walled carbon nanotubes, and a combination thereof, wherein the carbon material is about 3 wt % to about 20 wt % based on the total weight of the superhydrophobic electromagnetic field shielding material.

The curable resin may be a thermosetting resin selected from a group including one of an epoxy resin, a polyester resin, and a combination thereof, or a UV curable resin selected from a group including one of urethane acrylate, perfluoropolyether (PFPE), a silicon-based UV curable resin, a polydimethylsiloxane-based UV curable resin, an epoxy-based UV curable resin, a urethane-based UV curable resin, and a combination thereof. The carbon material may have a functional group of COOH.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
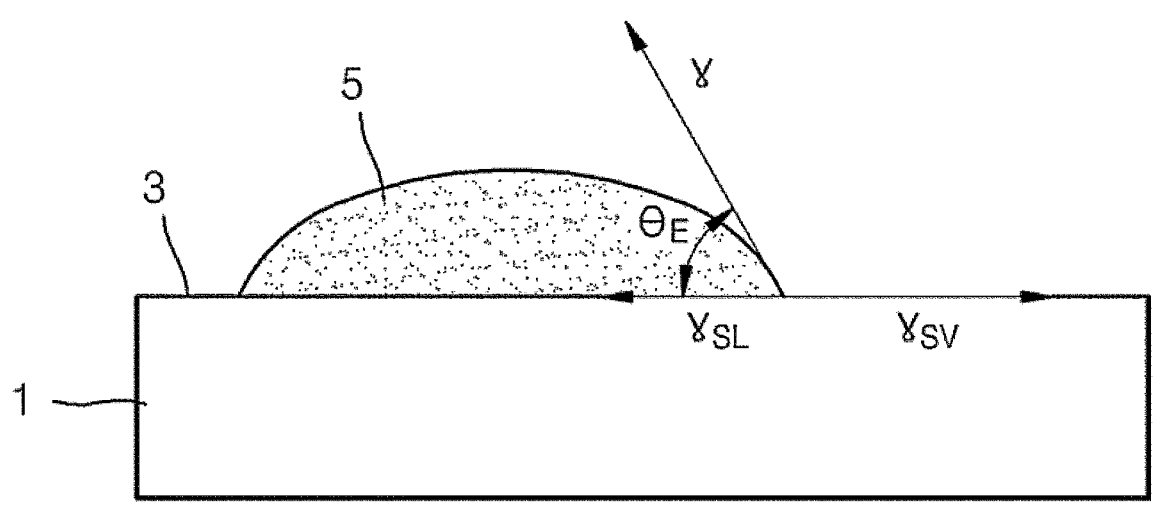
FIG. 1 shows a contact angle of a droplet at the surface of an object before texturing.

Example embodiments will be described more fully hereinafter with reference to the accompanying drawings. As those skilled in the art would realize, the described embodiments may be modified in various different ways, all without departing from the spirit or scope. In the drawing, parts having no relationship with the explanation are omitted for clarity, and the same or similar reference numerals designate the same or similar elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The superhydrophobic electromagnetic field shielding material according to example embodiments may include a composite material including a curable resin and a carbon material, wherein at least two depression patterns of a first depression pattern include a plurality of grooves of the same shape and a second depression pattern including a plurality of grooves of the same shape are formed on the surface.

The carbon material may be at least one selected from carbon fiber, carbon wire, carbon nanotubes, graphene, fullerene, and a combination thereof.

The superhydrophobic electromagnetic field shielding material may have improved electromagnetic wave shield performance and mechanical strength due to characteristics of the material, and has a superhydrophobic characteristic by forming the above patterns.

The curable resin may be selected from a thermosetting resin, a photocurable resin, and a combination thereof. The thermosetting resin and the photocurable resin may respectively include any resin known to function as a thermosetting resin or a photocurable resin without limitation.

The thermosetting resin may include an epoxy resin, a polyester resin, and a combination thereof. The photocurable resin is a resin that may be cured by electromagnetic waves and/or may be cured by UV of about a 365 nm wavelength. The photocurable resin may include, for example, a UV curable resin. The UV curable resin may include, for example, urethane acrylate, perfluoropolyether (PFPE), a silicon-based UV curable resin, a polydimethylsiloxane-based UV curable resin, an epoxy-based UV curable resin, a urethane-based UV curable resin, and a combination thereof.

The carbon material may be carbon nanotubes selected from single-walled carbon nanotubes, double-walled carbon nanotubes, multi-walled carbon nanotubes, and/or combinations thereof.

The carbon nanotubes may be chemically pretreated with an acid solution, e.g., a sulfuric acid, a nitric acid, a hydrochloric acid, and/or a phosphoric acid solution. The carbon nanotubes that are chemically pretreated with an acid solution may have a functional group of COOH on the end or on the side of the carbon nanotube. Acid treating, and the concentration and impregnation time of the acid solution, may be controlled in order to determine the content of the COOH functional group formed in the carbon nanotubes. A chemical pretreatment may be conducted by any known method without specific limitation.

The superhydrophobic electromagnetic field shielding material may include the carbon material in the content of about 3 wt % to about 20 wt % based on the total weight of the superhydrophobic electromagnetic field shielding material. If the superhydrophobic electromagnetic field shielding material includes the carbon material within the above range, appropriate shield performance may be secured while a process may be smoothly conducted. The content range of the carbon material may be appropriately controlled according to a desired use. For example, the superhydrophobic electromagnetic field shielding material including a carbon material in the above content range may be appropriate for an electromagnetic field shield use, e.g., a magnetic tape, a sensor, a nanoprobe and/or an electromagnetic field shield coating material. Because the superhydrophobic electromagnetic field shielding material includes the carbon material, the superhydrophobic electromagnetic field shielding material may have improved fatigue strength, toughness, rigidity, hardness, and/or strength, in addition to having improved electromagnetic field shield performance due to intrinsic electrical and magnetic characteristics of the carbon material.

The superhydrophobic electromagnetic field shielding material may alleviate environmental pollution damage to the carbon material due to the superhydrophobic characteristic. Because the superhydrophobic electromagnetic field shielding material having a superhydrophobic surface has improved dryness and higher water repellency, the superhydrophobic electromagnetic field shielding material may have self-cleaning performance and moisture reducing (or alternatively, preventing) performance, and thus may be applied in various industrial fields, e.g., a structural exterior material, household and industrial high performance glass, and/or an optical lens.

The waterproof and self-cleaning characteristics of a material are often referred to as the "lotus effect". The lotus effect is known as when the lotus inhabits a pond or a river where mud layers build up, a lotus leaf maintains a clean state without pollution due to a relatively small wax nanostructure. That is, a lotus leaf does not absorb water because the surface is very rough, and water drops roll down the lotus leaf while simultaneously entraining pollutants. Further, because the superhydrophobic characteristic may reduce friction resistance or drag force of a material surface, when applied to the surface of a means of transportation, e.g., an automobile, or in particular, a larger means of transportation, e.g., a plane, a ship, and/or a deep-sea probe, an improved fuel reduction effect may be expected. As described above, the superhydrophobic electromagnetic field shielding material forms a superhydrophobic surface having self-cleaning performance on a composite material including a carbon material, and thus may be useful as a multi-functional material wherein deterioration of electromagnetic characteristics by pollution is minimized or reduced. Hereinafter, the superhydrophobic electromagnetic field shielding material will be explained in detail with regard to a pattern formed on the surface.

Because the superhydrophobic electromagnetic field shielding material has at least a dual depression pattern structure formed on the surface, durability may be maintained while having relatively high hydrophobicity.

If an area that is exposed to air below a droplet contacting a solid is increased, because the interface of the droplet exposed to air has relatively high surface energy, the droplet may become spherical to reduce entire surface energy, and thus a contact angle to a solid may be increased. Therefore, to increase hydrophobicity, a solid surface below a droplet should be, for example, patterned so as to form as many air pockets below a droplet as possible, thus increasing a distance from a non-contact bottom surface so as to maintain air pockets even if disturbance is generated. The principle of appearance of hydrophobicity by structure is explained as follows.

Figure 2:
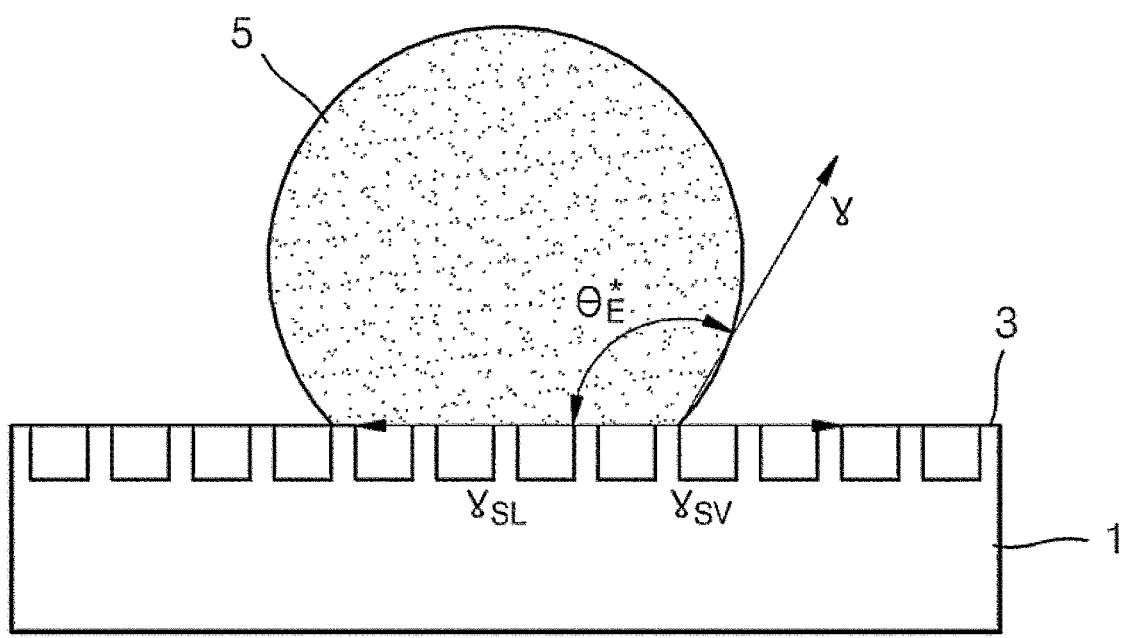
FIG. 2 shows a contact angle of a drop at the surface of an object after texturing.

FIG. 1 shows a contact angle of a droplet 5 at the surface 3 of an object 1 before forming microprotrusions and depressions on the surface, and FIG. 2 shows a contact angle of a droplet 5 at the surface 3 of an object 1 after texturing for forming microprotrusions and depressions on the surface.

The contact angle ($\theta_E$) of a droplet 5 before texturing may be determined by the following equation (Young's Equation).

$$\cos \theta_E = (\gamma_{SV} - \gamma_{SL})/\gamma \qquad \text{[Equation 1]}$$

Herein, $\gamma_{SV}$ is interfacial tension between a solid and a gas, $\gamma_{SL}$ is interfacial tension between a solid and a liquid, and $\gamma$ is interfacial tension between a liquid and a gas.

By texturing, the contact angle ($\theta_E^*$) of a droplet 5 increases by the following equation.

$$\cos \theta_E^* = -1 + \phi_A(\cos \theta_E + 1) \qquad \text{[Equation 2]}$$

Herein, $\phi_A$ is an area fraction of a solid that contacts a liquid below a droplet. In order for the liquid droplet 5 to not wet the textured surface, the following condition may be satisfied.

$$\cos \theta_E < \frac{\phi_A - 1}{\gamma - \phi_A} \qquad \text{[Equation 3]}$$

Herein, $\gamma$ is the ratio of a practical area to a protruded area. The practical area corresponds to the unfolded surface of the protruded structure.

The surface of the superhydrophobic electromagnetic field shielding material increases the contact angle by the above principle to form a structure that is capable of self-cleaning, reducing (or alternatively, preventing) droplet formation, and exhibiting relatively low drag force, and the pattern may be formed by imprinting.

The superhydrophobic electromagnetic field shielding material may form a pattern so as to overcome relatively low durability that is a problem of a common superhydrophobic surface, while maintaining superhydrophobicity.

Figure 3:
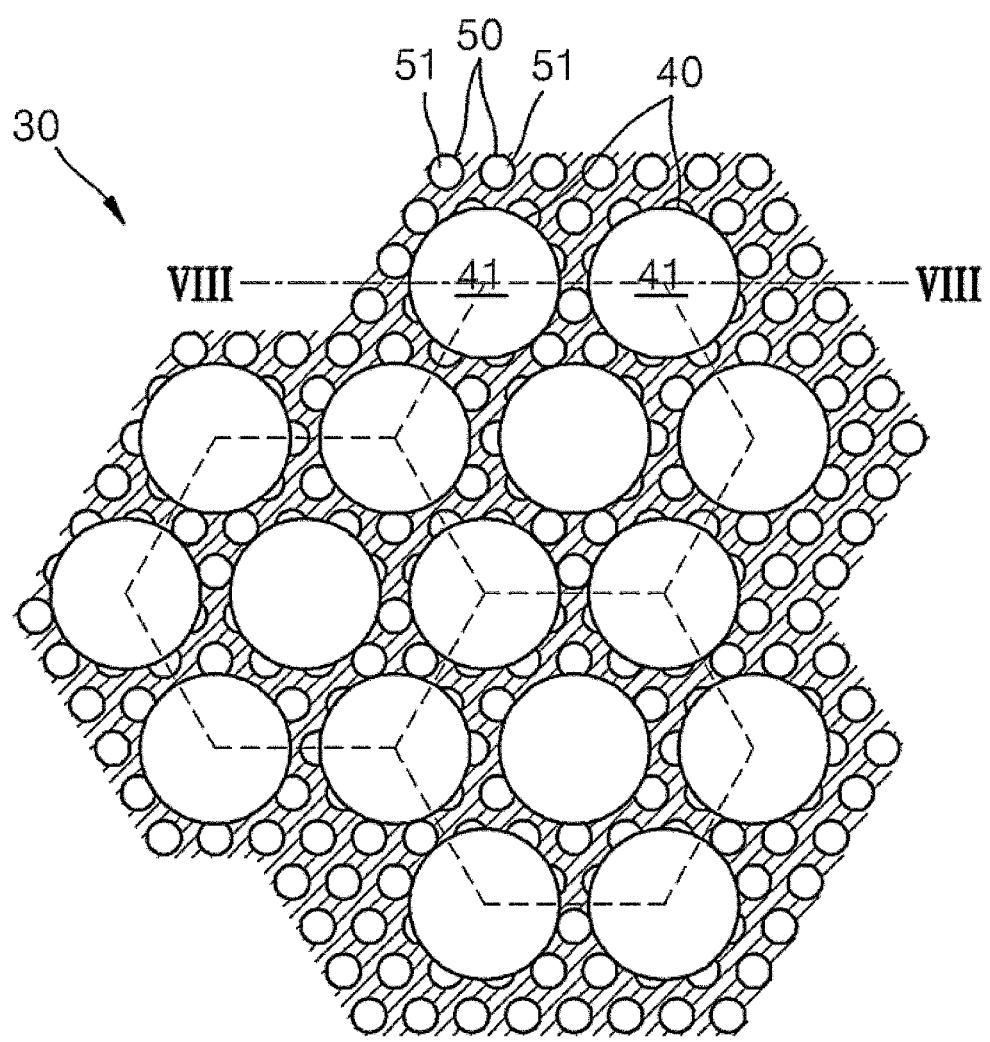
FIG. 3 is a top plan view showing a pattern formed on the surface of superhydrophobic electromagnetic field shielding material according to example embodiments.
Figure 4:
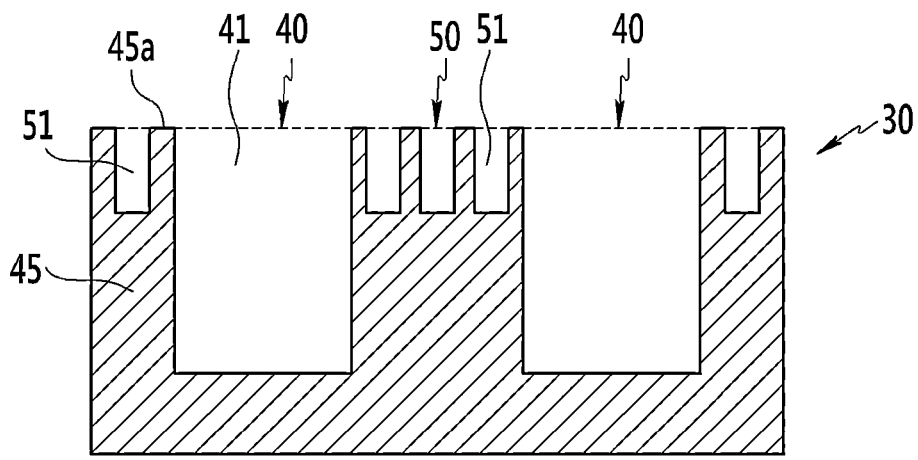
FIG. 4 is a cross-sectional view taken along the VIII-VIII line of FIG. 3.

FIG. 3 is a top plan view showing a part of the surface of a superhydrophobic electromagnetic field shielding material 30 according to example embodiments, and FIG. 4 is a cross-sectional view taken along the VIII-VIII line of FIG. 3.

Referring to FIG. 3 and FIG. 4, the superhydrophobic electromagnetic field shielding material 30 has a depression structure at a solid surface instead of a protrusion structure at a sold surface so as to maintain durability while having desirably high hydrophobicity. The superhydrophobic electromagnetic field shielding material 30 may have at least two depression patterns where two or more pattern structures each including a plurality of grooves are formed. For example, the depression grooves may be formed in a microsize or a nanosize.

FIG. 3 and FIG. 4 show an example where the superhydrophobic electromagnetic field shielding material 30 includes a first depression pattern 40 and a second depression pattern 50. The superhydrophobic electromagnetic field shielding material 30 has a first depression pattern 40 having a larger size, and a second depression pattern 50 having a smaller size on the upper surface 45a of a spacer wall 45 of the first depression pattern 40, thus having at least a dual depression pattern structure.

The first depression pattern 40 includes a plurality of first depression grooves 41 formed on a solid surface. The second depression pattern 50 includes a plurality of second depression grooves 51 of a smaller size than the first depression grooves 41, which are formed on the upper surface of the spacer wall 45 of the first depression pattern 40. The first depression grooves 41 and the second depression grooves 51 have different sizes, and the diameter of grooves, the distance between grooves, and the depth of grooves may be different.

As shown in FIG. 3, the first depression pattern 40 may be formed so that the first depression grooves 41 may form a triangle array disposition, for example, an equilateral triangle array disposition. When the first depression grooves 41 are formed so as to make an equilateral triangle array disposition, the first depression pattern 40 may form a disposition structure where the first depression grooves 41 are located in the center and the vertexes of a hexagon. As such, the first depression pattern 40 may be formed of a structure where the first depression grooves 41 are closely filled in the hexagonal shapes.

The second depression pattern 50 may be formed of a structure that is depressed from the upper surface 45a of the spacer wall 45 of the first depression pattern 40, and the surface of the superhydrophobic electromagnetic field shielding material 30, wherein the second depression pattern 50 may be formed such that the second depression grooves 51 may generally form a triangle array disposition, for example, an equilateral triangle array disposition. The second depression grooves 51 may not be formed in a depression region where the first depression grooves 41 are formed, but may be formed so as to generally make a triangle array disposition, for example, an equilateral triangle array disposition in a region other than the first depression grooves 41, namely, on the upper surface 45a of the spacer wall 45 surrounding the first depression grooves 41. When the second depression grooves 51 are formed so as to generally make an equilateral triangle array disposition, the second depression pattern 50 may form a disposition structure where the second depression grooves 51 exist in the center and the vertexes of a hexagon. As such, the second depression pattern 50 may be formed of a structure where the second depression grooves 51 are closely filled in the hexagonal shapes.

The first depression pattern 40 and the second depression pattern 50 may be formed so as to constitute a dual circular groove imprinted surface that is closely filled in the hexagonal shapes, as shown in FIG. 3. FIG. 3 shows an example wherein both the first depression grooves 41 of the first depression pattern 40 and the second depression grooves 51 of the second depression pattern 50 are formed in a circular shape, but the shape of the first depression grooves 41 and the second depression grooves 51 may be varied.

When the first depression pattern 40 and the second depression pattern 50 are formed so as to constitute a dual circular groove imprinted surface that is closely filled in the hexagonal shapes, as shown in FIG. 3, the following contact angle may be expected.

Figure 5:
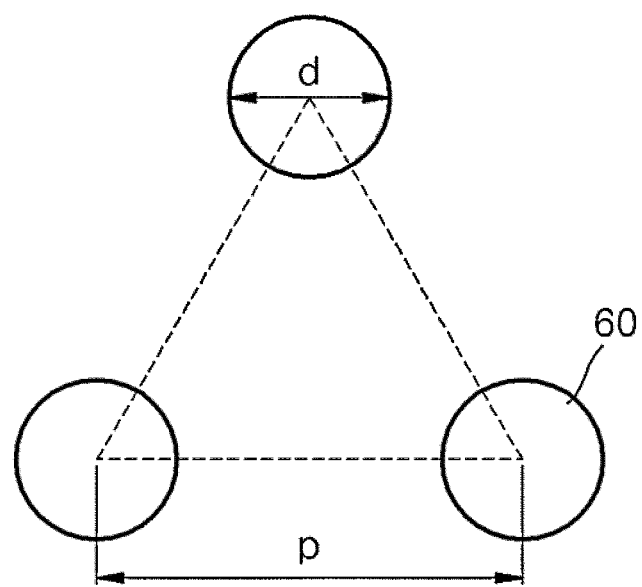
FIG. 5 shows a disposition interval and size of three depression holes according to example embodiments.

FIG. 5 shows a disposition interval and size of three depression holes according to example embodiments. Referring to FIG. 5, if the size of a depression groove 60, that is, the size of the first or second depression groove 41 and 51 is d, the distance therebetween is p, and the pattern radius $\lambda=d/p$, the dual depression pattern structure of the first depression pattern 40 and the second depression pattern 50 may be formed so as to satisfy the following Equation 4.

$$\cos \theta^* = \phi_L(\phi_S \cos \theta_E + (\phi_S-1)) + (\phi_L-1) \quad \text{[Equation 4]}$$

Herein, $\theta^*$ is a contact angle of a droplet at a solid surface where the first depression pattern 40 and the second depression pattern 50 are formed, $\theta_E$ is a contact angle to a solid surface before the first depression pattern 40 and the second depression pattern 50 are formed, and $\phi_L$ for the first depression pattern and $\phi_S$ for the second depression pattern, respectively, satisfy $\phi = 1 - (\pi/2\sqrt{3})\lambda^2$.

Specifically, if the size of the first depression groove 41 is $d_L$ and the distance therebetween is $p_L$, the pattern radius $\lambda_L$ may be $\lambda_L = d_L/p_L$ and $\phi_L$ may be $\phi_L = 1 - (\pi/2\sqrt{3})\lambda_L^2$. Further, if the size of the second depression groove 51 is $d_s$ and the distance therebetween is $p_s$, the pattern radius $\lambda_s$ may be $\lambda_s = d_s/p_s$ and $\phi_s$ may be $\phi_s = 1 - (\pi/\sqrt{3})\lambda_s^2$. $\cos \theta_E$ may be calculated by Young's Equation of Equation 1.

A process for obtaining Equation 4 that shows an example of the superhydrophobic electromagnetic field shielding material 30 having a dual depression pattern structure of a first depression pattern 40 of a larger size and a second depression pattern 50 of a smaller size is as follows.

Young's Equation of Equation 1 and energy change (dE) per unit area of Equation 5 are considered.

$$dE = (w + v(1-w))\gamma + (1-v)(1-w)(\gamma_{SL} - \gamma_{SV}) + \gamma \cos \theta^* \quad \text{[Equation 5]}$$

Herein, w represents fractions of droplet/gas interfaces of larger air pockets and smaller air pockets at a solid surface below the droplet. The larger air pocket may represent a relatively large first depression groove 41, and the smaller air pocket may represent a relatively small second depression groove 51.

If a value minimizing or reducing energy change, namely dE=0, is substituted into Equation 5, the following Equation 6 may be obtained.

$$\cos \theta^* = (1-w)((1-v)\cos \theta_E - v) - w \quad \text{[Equation 6]}$$

Therefore, the fractions of the solid/liquid interface of the larger air pockets is 1−w, the fractions of the solid/liquid interface of the small air pockets is 1−v, and thus $\Phi_L = 1-w$ and $\Phi_s = 1-v$ are substituted into Equation 6 to obtain Equation 4.

If the sizes of the first depression groove 41 and the second depression groove 51 are identical, w=v and $\Phi = 1-w$ are substituted into Equation 6 to obtain Equation 7.

$$\cos \theta^* = \Phi^2(\cos \theta_E + 1) - 1 \quad \text{[Equation 7]}$$

The following Table 1 shows a design example of a dual depression pattern structure of a first depression pattern 50 having first depression grooves 41 of a relatively large size and pitch and a second depression pattern 50 having second depression grooves 51 of a relatively small size and pitch.

TABLE 1

| | | |
|---|---|---|
| $p_L =$ | 60 μm | First depression groove pattern pitch |
| $d_L =$ | 58 μm | First depression groove pattern diameter |
| $p_S =$ | 8 μm | Second depression groove pattern pitch |
| $d_S =$ | 7 μm | Second depression groove pattern diameter |
| $\theta =$ | 110 | Contact angle with solid surface without depression groove |
| $\lambda_L =$ | 0.9667 | First depression groove pattern radius |
| $\lambda_S =$ | 0.875 | Second depression groove pattern radius |
| $\phi_L =$ | 0.15 | Solid/liquid interface ratio relative to first depression groove |
| $\phi_S =$ | 0.30 | Solid/liquid interface ratio relative to second depression groove |
| $\theta^*$ | 166 | Contact angle in Cassie state |

The pattern radius $\lambda_L$, $\lambda_S$ for the first and the second depression grooves 41 and 51 represent the ratio of a depression groove diameter to a depression groove pitch, and as explained above, they are calculated from $\lambda_L = d_L/p_L$, $\lambda_s = d_s/p_s$. $\phi_L$ is calculated from $\phi_L = 1 - (\pi/2\sqrt{3})\lambda_L^2$, and $\phi_S$ is calculated from $\phi_S = 1 - (\pi/2\sqrt{3})\lambda_S^2$.

As can be seen from the design example of Table 1, the contact angle to the solid surface without a depression groove is $\theta = 110$, while the contact angle to the solid surface where the at least two depression patterns of the first depression pattern 40 and the second depression pattern 50 of different depression groove sizes are formed is largely increased to $\theta^* = 166$.

The superhydrophobic electromagnetic field shielding material 30 may have a depression structure at the surface, and form a depression structure of a smaller size on the spacer wall 45 that forms a depression structure, and thus may have superhydrophobicity because an area between a droplet and a solid surface where air is collected may be increased. The superhydrophobic electromagnetic field shielding material 30 may have durability to scratching due to relatively high surface rigidity by forming a depression structure. Further, because a small depression structure is dually formed with a relatively large depression structure, even when the small depression structure is damaged, a basic superhydrophobic structure may be maintained by the large depression structure, thus having higher durability.

Because the superhydrophobic electromagnetic field shielding material 30 may use a pattern of a lower slenderness ratio compared to a single structure, by forming at least a dual depression structure, the process may be simplified. The superhydrophobic electromagnetic field shielding material 30 may be manufactured by a process with higher productivity, e.g., nanoimprinting.

Figure 6:
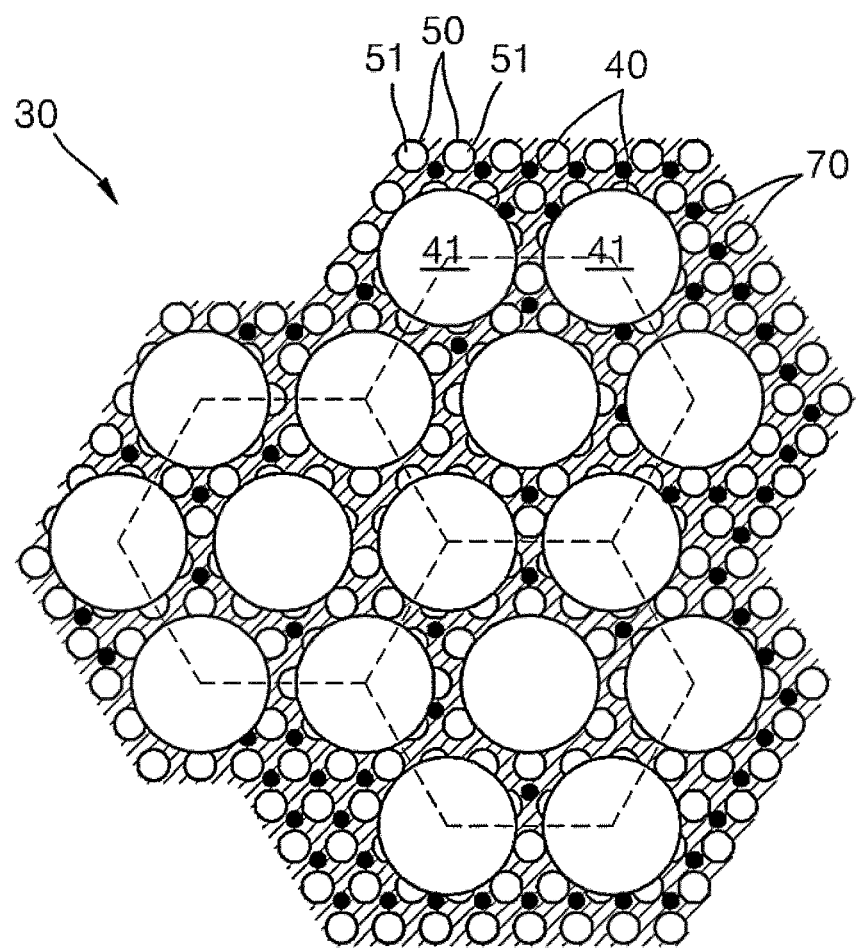
FIG. 6 is a top plan view showing a pattern formed on the surface of a superhydrophobic electromagnetic field shielding material according to example embodiments.
Figure 7:
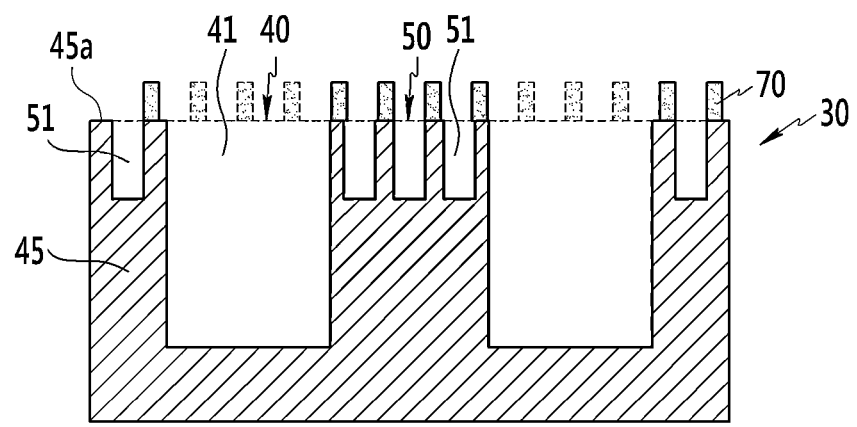
FIG. 7 is a cross-sectional view showing a pattern formed on the surface of the superhydrophobic electromagnetic field shielding material of FIG. 6.

FIG. 6 is a top plan view showing a pattern formed on the surface of the superhydrophobic electromagnetic field shielding material 30 according to example embodiments, and FIG. 7 is a cross-sectional view showing the cross-section of a pattern formed on the surface of the superhydrophobic electromagnetic field shielding material 30 of FIG. 6.

On the surface of the at least a dual depression structure of the superhydrophobic electromagnetic field shielding material 30, a protruding portion 70, for example, protruded columns or particles, may be further formed so as to form a rough surface, or a protruding portion may replace a small depression structure formed on the solid surface. In example embodiments, even if the protruding portion is damaged, a relatively large depression structure remains below and hydrophobicity is maintained.

According to example embodiments, a method of manufacturing the superhydrophobic electromagnetic field shielding material is provided. The method of manufacturing the superhydrophobic electromagnetic field shielding material includes coating an electromagnetic field shielding material composition including a curable resin and a carbon material on a substrate, so as to form an electromagnetic field shielding material composition layer; imprinting such that the side of a mold having a side that forms at least two depression patterns is transcribed on the surface of the electromagnetic field shielding material composition layer; and heat curing or photocuring the electromagnetic field shielding material composition layer where the at least two depression patterns are formed, so as to manufacture the superhydrophobic electromagnetic field shielding material. The electromagnetic field shielding material composition may include the carbon material in the amount of about 3 wt % to about 20 wt % based on the solid content of the electromagnetic field shielding material composition.

Hereinafter, referring to FIGS. 8A-8E, each step of a method of manufacturing the superhydrophobic electromagnetic field shielding material will be explained in detail. FIGS. 8A-8E are schematic views showing each step of a method of manufacturing a superhydrophobic electromagnetic field shielding material according to example embodiments.

An electromagnetic field shielding material composition including a curable resin and a carbon material is prepared. The detailed description of the curable resin and carbon material are as explained above.

Figure 8A:
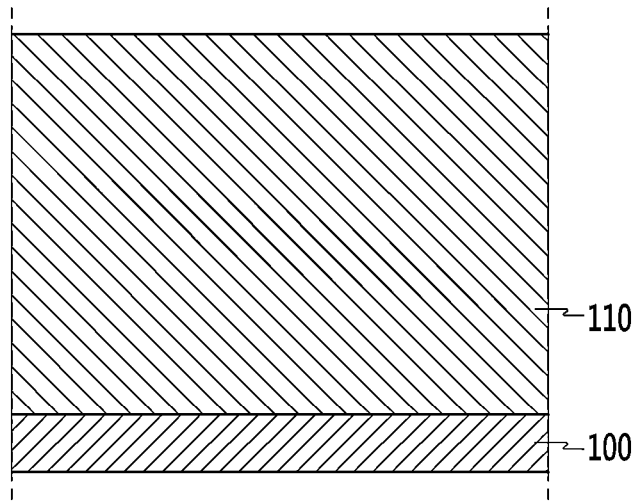
FIGS. 8A-8E are schematic views showing each step of a method of manufacturing a superhydrophobic electromagnetic field shielding material according to example embodiments.

Carbon nanotubes that may be used as the carbon material may include those chemically pretreated by impregnating with an acid solution, e.g., a sulfuric acid, nitric acid, hydrochloric acid, and/or phosphoric acid solution. When the chemical pretreatment is conducted, the concentration of the acid solution, and impregnation time may be controlled to determine the content of a COOH functional group formed in the carbon nanotubes, and the chemical pretreatment may be conducted by any known method without specific limitation. If the chemically pretreated carbon nanotubes are used, dispersibility in an electromagnetic field shielding material composition may be improved, and mechanical strength may be further improved. The electromagnetic field shielding material composition may further include additives required according to the use, e.g., a photoinitiator, a dispersing agent, an antifoaming agent, an antioxidizing agent, an ultraviolet (UV) absorber, and/or a stabilizer, in addition to the curable resin and the carbon material. The prepared electromagnetic field shielding material composition is coated on a substrate 100 to form an electromagnetic field shielding material composition layer 110 (FIG. 8A).

Figure 8B:
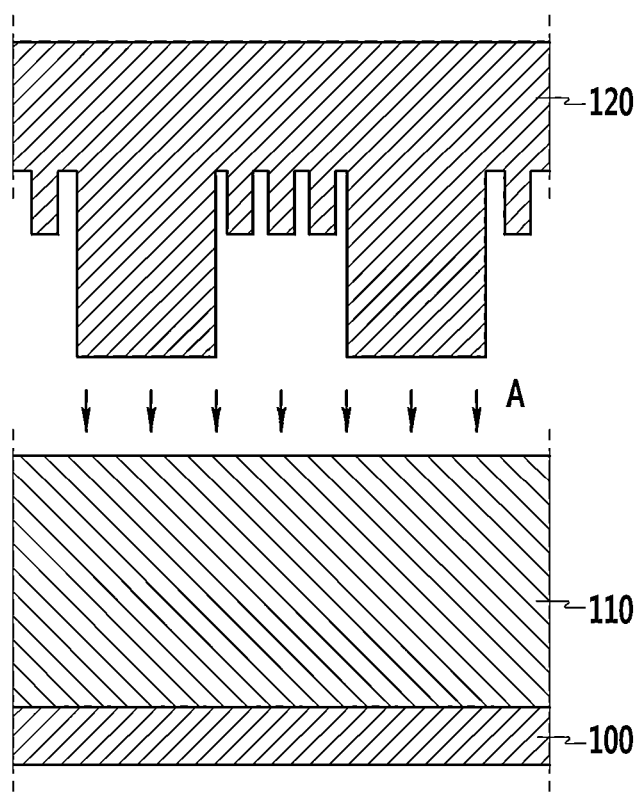
Figure 8C:
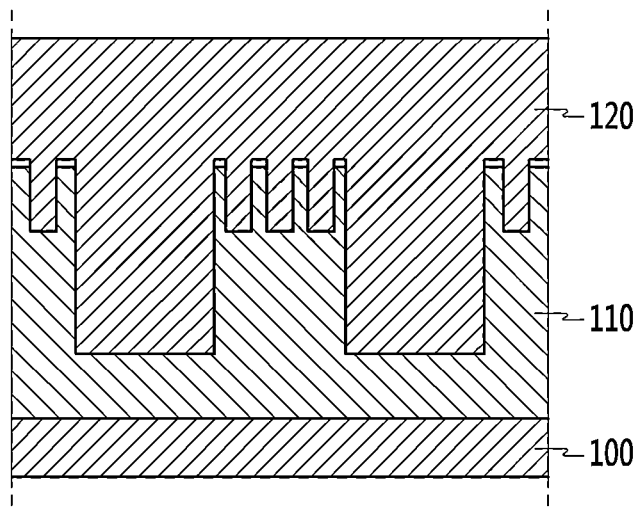

As shown in FIG. 8B, a pattern shaping mold 120 for forming at least two depression patterns is prepared, and the pattern shaping mold 120 is placed on the electromagnetic field shielding material composition layer 110 so that the exposed surface of the electromagnetic field shielding material composition layer 110 and the two or more depression patterns may be in contact, and pressed (in the arrow A direction of FIG. 8B) to imprint so that the at least two depression patterns may be transcribed on the surface of the electromagnetic field shielding material composition layer 110 (FIG. 8C). The two or more depression patterns are as explained above, and so detailed explanations are skipped here.

Because the electromagnetic field shielding material composition uses a curable resin, the pressure while imprinting may be lower than the pressure in the case where a thermoplastic resin is used. The pressure while imprinting is related to the viscosity of the electromagnetic field shielding material composition, and because an electromagnetic field shielding material composition using a curable resin has lower viscosity than a thermoplastic resin composition, imprinting may be conducted at a lower pressure than required for imprinting a thermoplastic resin composition having higher viscosity.

By applying an imprinting process using the pattern shaping mold 120 while using a curable resin, a clear pattern may be formed.

Figure 8D:
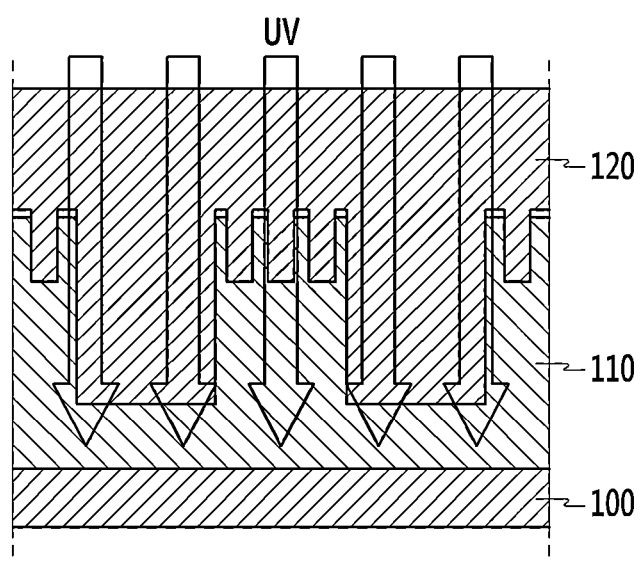

FIG. 8C shows the imprinted electromagnetic field shielding material composition layer 110 and the pattern shaping mold 120, and in this state, the imprinted electromagnetic field shielding material composition layer 110 may be cured. FIG. 8D shows photocuring, for example, UV curing, wherein UV is irradiated to the electromagnetic field shielding material composition layer 110 imprinted with the pattern shaping mold 120 to UV cure the electromagnetic field shielding material composition layer 110. As such, if curing is conducted while the pattern shaping mold 120 is connected to the electromagnetic field shielding material composition layer 110, and then the mold is released (FIG. 8E), more precise patterns may be formed. To cure while the pattern shaping mold 120 is not connected to the electromagnetic field shielding material composition layer 110, the pattern shaping mold 120 should be transparent so as to transmit light, e.g., UV. If light energy, e.g., UV, is applied to the electromagnetic field shielding material composition layer 110, a photoinitiator may be separated in the form of unstable free radicals, and the free radicals may disconnect a bond of a reactive functional group of the carbon material or a carbon double bond of monomers with relatively weak bonding, and therefore, recombine to form an active monomer. The formed active monomer may form a long chain through a chain reaction in which a carbon double bond of the surrounding monomer is disconnected and recombined. The reaction may progress until all free radicals completely disappear to reach a stable state.

Figure 8E:
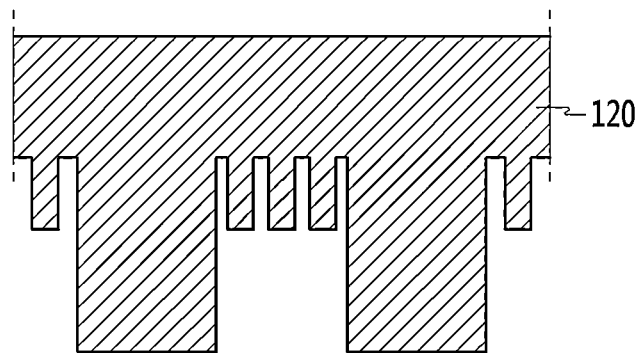
Figure 8E:
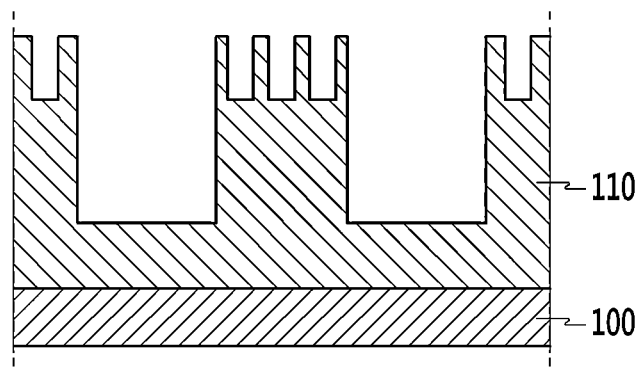

FIG. 8E shows manufacturing of the superhydrophobic electromagnetic field shielding material wherein after curing, the pattern shaping mold 120 is released, and a pattern is formed. Because the electromagnetic field shielding material composition uses a curable resin, the time for the curing and releasing processes may be shortened. In the case of a thermoplastic resin composition, after the pattern is formed by heating, the composition should be cooled for a sufficient time and then the mold should be released to minimize or reduce modification of the pattern and maintain the shape of the pattern before releasing. To the contrary, the electromagnetic field shielding material composition using a curable resin does not require time for cooling, and allows immediate release after curing is completed, and thus, the process time may be further shortened.

Further, because the electromagnetic field shielding material composition uses a curable resin, the electromagnetic field shielding material composition does not require a high temperature process, and thus offers a wide choice of the kind of material of the pattern shaping mold 120. Thus, as the pattern shaping mold 120, a flexible mold made of a polymer material as well as a hard stamp made of a material, for example, a metal, e.g., Ni and/or Si, or quartz, may be used. The pattern shaping mold 120 may be made of a polymer material, for example, polyurethane, polydimethylsiloxane (PDMS), silicon oxide $SiO_2$, and/or a combination thereof.

As such, because a flexible mold made of a polymer material may be used, the electromagnetic field shielding material may be applied for a roll printing process to enable uniform pattern transcription to a relatively large area.

The method of manufacturing the superhydrophobic electromagnetic field shielding material is not a two-step process wherein two or more pattern shaping molds are used in order to form at least two depression patterns, but the method may be conveniently conducted as a single process by using one pattern shaping mold 120 that is capable of simultaneously embodying at least two depression patterns as explained above.

As explained, the method of manufacturing the superhydrophobic electromagnetic field shielding material may embody various fine patterns as well as micropatterns due to a desirable pattern transcription property, and may improve efficiency, economic efficiency, and productivity. The method of example embodiments may be applied to various fields because the method enables a room temperature low pressure process, and may simply provide the superhydrophobic characteristic. The above-explained superhydrophobic electromagnetic field shielding material may be embodied by the above manufacturing method.

Hereinafter, example embodiments are illustrated in more detail with reference to examples. However, the following are example embodiments and are not limiting.

EXAMPLES

Example 1

94 wt % of a perfluoropolyether (PFPE) resin, 5 wt % of multi-walled carbon nanotubes that are chemically pretreated in a mixed solution of sulfuric acid and nitric acid, and 1 wt % of 1-hydroxylcyclohexyl phenyl ketone as a photoinitiator are mixed to prepared an electromagnetic field shielding material composition, which is then coated on a glass substrate in an appropriate amount to form an electromagnetic field shielding material composition layer. A transparent polyurethane stamp having a depression pattern structure of Table 1 is prepared, imprinted at room temperature under a 500 Pa pressure according to the sequence as shown in FIGS. 8A-8E, UV-irradiated for curing, and immediately released to manufacture the superhydrophobic electromagnetic field shielding material.

Comparative Example 1

95 wt % of reactive ethylene terpolymer (RET) and 5 wt % of multi-walled carbon nanotubes that are chemically pretreated with a nitric acid solution are mixed to prepare a composition, which is then coated on a glass substrate in an appropriate amount to form a composition layer. The composition layer is heated to 75° C., the melting point of the composition layer, on a hot plate. Subsequently, a Ni stamp having a depression pattern structure as described in Table 1 is placed on the composition layer, and a pressure of 1000 Pa is applied for imprinting. The resulting structure is allowed to stand for 1 hour to cool, and then the Ni stamp is released to manufacture the electromagnetic field shielding material.

Figure 9:
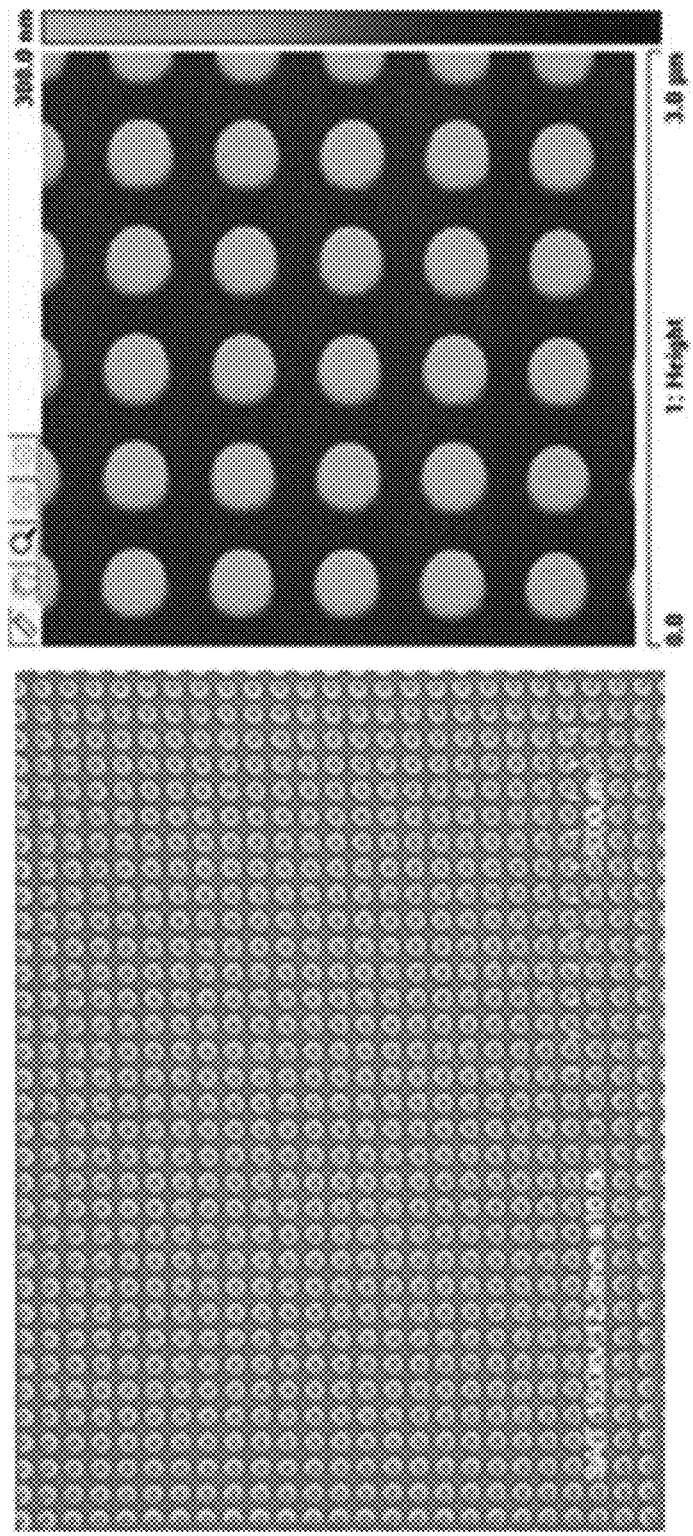
FIG. 9 is a surface photograph of the superhydrophobic electromagnetic field shielding material prepared in an example according to example embodiments.
Figure 10:
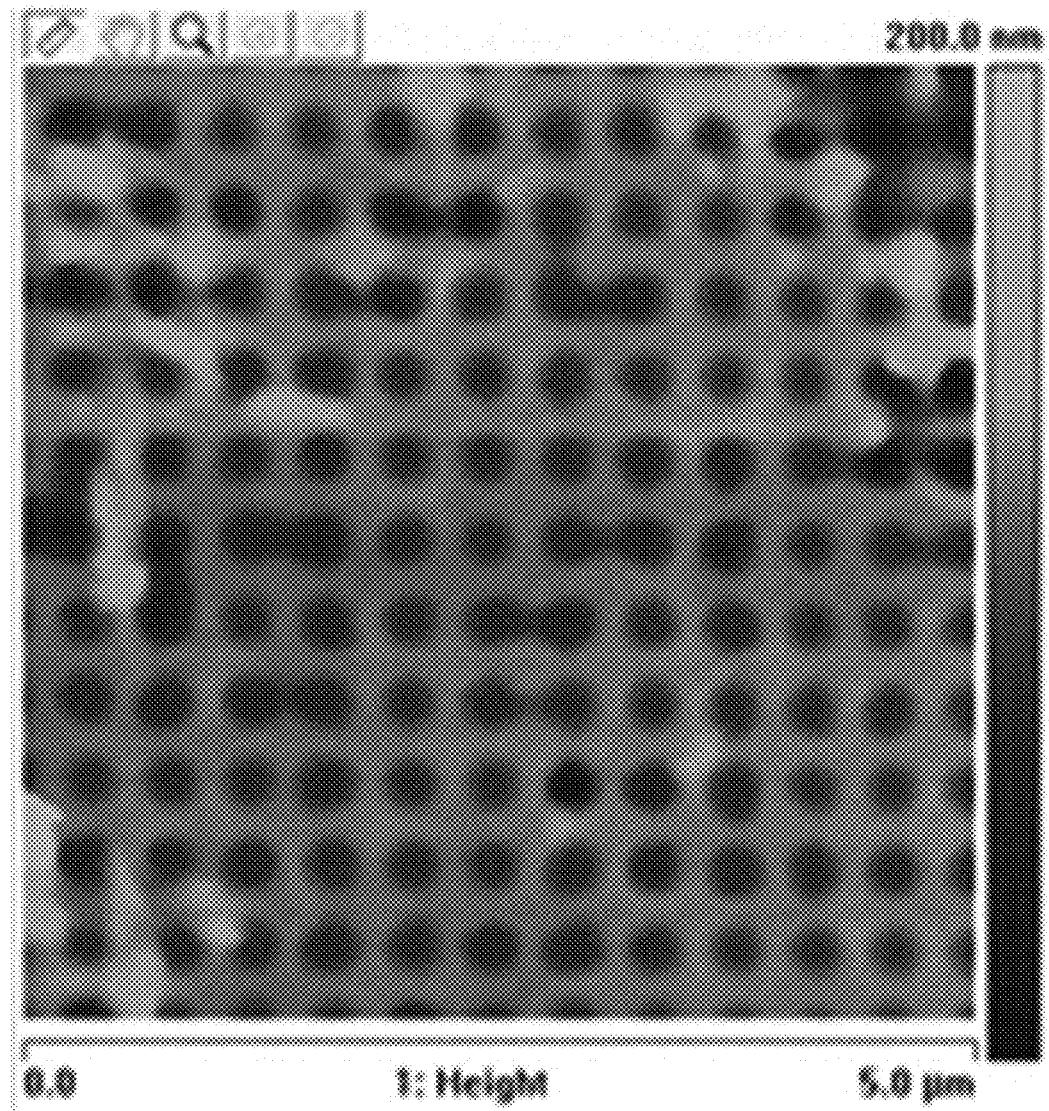
FIG. 10 is a surface photograph of the superhydrophobic electromagnetic field shielding material prepared in a comparative example.

FIG. 9 is a surface photograph of the superhydrophobic electromagnetic field shielding material manufactured in Example 1, and FIG. 10 is a surface photograph of the electromagnetic field shielding material manufactured in Comparative Example 1. In the electromagnetic field shielding material of FIG. 10, defects are observed, the pattern transcription property is undesirable, and the pattern depth is only about 25% of that of the Ni stamp pattern. To the contrary, in the superhydrophobic electromagnetic field shielding material of FIG. 9, the stamp pattern is reflected as it is, defects and uniformity are largely improved compared to FIG. 10, and the pattern height is very similar to the pattern height of the stamp.

While this disclosure has been described in connection with what is presently considered to be practical exemplary embodiments, it is to be understood that the inventive concepts are not limited to the disclosed embodiments, but, on the contrary, is intended to cover various modifications and equivalent arrangements included within the spirit and scope of the appended claims.

What is claimed is:

1. A superhydrophobic electromagnetic field shielding material comprising a curable resin and a carbon material, the superhydrophobic electromagnetic field shielding material including at least two depression patterns on an exposed surface,
    wherein the at least two depression patterns include a first depression pattern including a plurality of grooves having a same shape and a second depression pattern including a plurality of grooves having a same shape, and
    wherein the carbon material is about 3 wt % to about 20 wt % based on the total weight of the superhydrophobic electromagnetic field shielding material.

2. The superhydrophobic electromagnetic field shielding material of claim 1, wherein the curable resin is one of a thermosetting resin, a photocurable resin, and a combination thereof.

3. The superhydrophobic electromagnetic field shielding material of claim 1, wherein the curable resin is a thermosetting resin selected from a group including one of an epoxy resin, a polyester resin, and a combination thereof, or a UV curable resin selected from a group including one of urethane acrylate, perfluoropolyether (PFPE), a silicon-based UV curable resin, a polydimethylsiloxane-based UV curable resin, an epoxy-based UV curable resin, a urethane-based UV curable resin, and a combination thereof.

4. The superhydrophobic electromagnetic field shielding material of claim 1, wherein the carbon material is one of single-walled carbon nanotubes, double-walled carbon nanotubes, multi-walled carbon nanotubes, and a combination thereof.

5. The superhydrophobic electromagnetic field shielding material of claim 1, wherein the carbon material has a functional group of COOH.

6. The superhydrophobic electromagnetic field shielding material of claim 1, wherein at least one of the first depression pattern and the second depression pattern are respectively formed such that the plurality of grooves of the same shape of each of the first depression pattern and the second depression pattern are disposed in a triangle array.

7. The superhydrophobic electromagnetic field shielding material of claim 6, wherein the triangle array is an equilateral triangle array, and the plurality of grooves of each of the first depression pattern and the second depression pattern are arranged in the shape of a hexagon such that the plurality of grooves are located in at least one of a center and vertexes of the hexagon.

8. The superhydrophobic electromagnetic field shielding material of claim 1, further comprising:
    a protruding portion on the exposed surface of the superhydrophobic electromagnetic field shielding material.

9. The superhydrophobic electromagnetic field shielding material of claim 1, wherein a size of one groove of the plurality of grooves of at least one of the first depression pattern and the second depression pattern is d, a distance between the plurality of grooves at least one of the first depression pattern and the second depression pattern is p, and a pattern radius satisfies an equation $\lambda = d/p$, and
    the first depression pattern and the second depression pattern are formed so as to satisfy the following Equation 4:

$$\cos \theta^* = \phi_L(\phi_S \cos \theta_E + (\phi_S - 1)) + (\phi_L - 1) \qquad <\text{Equation 4}>$$

wherein $\theta^*$ is a contact angle at the exposed surface where the first depression pattern and the second depression pattern are formed, $\theta_E$ is a contact angle at a solid surface before the first depression pattern and the second depression pattern are formed, and $\phi_L$ is calculated from $\phi = 1 - (\pi/2\sqrt{3})\lambda^2$ using $\lambda$ for the first depression pattern and $\phi_S$ is calculated from $\phi = 1 - (\pi/2\sqrt{3})\lambda^2$ using $\lambda$ for the second depression pattern.

10. A method of manufacturing superhydrophobic electromagnetic field shielding material, comprising:
    coating an electromagnetic field shielding material composition on a substrate to form an electromagnetic field shielding material composition layer, the electromagnetic field shielding material composition including a curable resin and about 3 wt % to about 20 wt % of a carbon material based on the total weight of the superhydrophobic electromagnetic field shielding material;
    imprinting the electromagnetic field shielding material composition layer using a pattern shaping mold, the pattern shaping mold including a surface configured to form at least two depression patterns on an exposed surface of the electromagnetic field shielding material composition layer; and
    curing a region of the electromagnetic field shielding material composition layer where the at least two depression patterns are formed.

11. The method of manufacturing superhydrophobic electromagnetic field shielding material of claim 10, wherein the carbon material in the electromagnetic field shielding material composition is carbon nanotubes that are chemically pretreated with an acid solution.

12. The method of manufacturing superhydrophobic electromagnetic field shielding material of claim 10, wherein the pattern shaping mold is made of one of metal, quartz, and a polymer material.

13. The method of manufacturing the superhydrophobic electromagnetic field shielding material of claim 12, wherein the pattern shaping mold is made of the polymer material, and the polymer material is transparent so as to transmit light.

14. The method of manufacturing the superhydrophobic electromagnetic field shielding material of claim 13, wherein the curing process is a photocuring process that includes irradiating the region of the electromagnetic field shielding material composition layer where the at least two depression patterns are formed with UV light through the pattern shaping mold made of the transparent polymer material.

15. The method of manufacturing the superhydrophobic electromagnetic field shielding material of claim 12, wherein the polymer material is one of polyurethane, polydimethylsiloxane (PDMS), silicon oxide ($SiO_2$), and a combination thereof.

16. The method of manufacturing the superhydrophobic electromagnetic field shielding material of claim 10, wherein the curing process is a heat curing process.

17. The method of manufacturing superhydrophobic electromagnetic field shielding material of claim 10, wherein the imprinting is performed at room temperature.

18. A superhydrophobic electromagnetic field shielding material comprising:

a curable resin including one of a thermosetting resin, a photocurable resin, and a combination thereof; and a carbon material including one of single-walled carbon nanotubes, double-walled carbon nanotubes, multi-walled carbon nanotubes, and a combination thereof, wherein the carbon material is about 3 wt % to about 20 wt % based on the total weight of the superhydrophobic electromagnetic field shielding material.

19. The superhydrophobic electromagnetic field shielding material of claim 18, wherein the curable resin is a thermosetting resin selected from a group including one of an epoxy resin, a polyester resin, and a combination thereof, or a UV curable resin selected from a group including one of urethane acrylate, perfluoropolyether (PFPE), a silicon-based UV curable resin, a polydimethylsiloxane-based UV curable resin, an epoxy-based UV curable resin, a urethane-based UV curable resin, and a combination thereof.

20. The superhydrophobic electromagnetic field shielding material of claim 1, wherein the carbon material has a functional group of COOH.

\* \* \* \* \*